(12) United States Patent
Xiao et al.

(10) Patent No.: US 8,008,213 B2
(45) Date of Patent: Aug. 30, 2011

(54) SELF-ASSEMBLY PROCESS FOR MEMORY ARRAY

(75) Inventors: Li Xiao, San Jose, CA (US); Jingyan Zhang, Santa Clara, CA (US); Huicai Zhong, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/285,220

(22) Filed: Sep. 30, 2008

(65) Prior Publication Data

US 2010/0078618 A1    Apr. 1, 2010

(51) Int. Cl.
*H01L 21/31*    (2006.01)
*H01L 21/469*    (2006.01)

(52) U.S. Cl. .......... 438/763; 438/758; 438/761; 365/51; 365/158; 257/E29.17

(58) Field of Classification Search ................ 257/2–4, 257/295, 316, 530, E29.17; 365/51, 103, 365/148, 200, 158; 438/45, 102, 268, 763
See application file for complete search history.

(56) References Cited

U.S. PATENT DOCUMENTS

| | | | |
|---|---|---|---|
| 4,517,280 A | 5/1985 | Okamoto et al. | |
| 4,566,952 A | 1/1986 | Sprintschnik et al. | |
| 4,806,454 A | 2/1989 | Yoshida et al. | |
| 5,915,167 A | 6/1999 | Leedy | |
| 5,975,976 A | 11/1999 | Sekinger et al. | |
| 6,139,713 A | 10/2000 | Masuda et al. | |
| 6,278,231 B1 | 8/2001 | Iwasaki et al. | |
| 6,359,288 B1 | 3/2002 | Ying et al. | |
| 6,387,771 B1 | 5/2002 | Genz et al. | |
| 6,476,409 B2 | 11/2002 | Iwasaki et al. | |
| 6,541,386 B2 | 4/2003 | Aiba et al. | |
| 6,610,463 B1 | 8/2003 | Ohkura et al. | |
| 6,709,929 B2 | 3/2004 | Zhang et al. | |
| 6,853,049 B2 | 2/2005 | Herner | |
| 6,946,719 B2 | 9/2005 | Petti et al. | |
| 6,952,030 B2 | 10/2005 | Herner et al. | |
| 7,285,464 B2 | 10/2007 | Herner et al. | |
| 7,329,561 B2 * | 2/2008 | Symanczyk et al. .......... 438/102 |
| 7,410,838 B2 * | 8/2008 | Ang .............................. 438/131 |

(Continued)

FOREIGN PATENT DOCUMENTS

JP    2005-236003    9/2005

(Continued)

OTHER PUBLICATIONS

International Search Report and Written Opinion mailed Mar. 3, 2010, in International application No. PCT/US2009/058151.

(Continued)

*Primary Examiner* — Thanh V Pham
*Assistant Examiner* — Errol Fernandes
(74) *Attorney, Agent, or Firm* — The Marbury Law Group, PLLC

(57) ABSTRACT

A method of making a device includes forming at least one anodizable metal layer over at least one of an electrode or a semiconductor device, forming a plurality of pores in the anodizable metal layer by anodization of the anodizable metal layer to expose a portion of the electrode or semiconductor device, and filling at least one pore with a rewritable material such that at least some of the rewritable material is in electrical contact with the electrode or semiconductor device.

7 Claims, 13 Drawing Sheets

U.S. PATENT DOCUMENTS

| | | | |
|---|---|---|---|
| 2002/0118027 | A1 | 8/2002 | Routkevitch et al. |
| 2003/0031438 | A1 | 2/2003 | Kambe et al. |
| 2004/0157354 | A1* | 8/2004 | Kuriyama et al. ............... 438/45 |
| 2005/0019975 | A1 | 1/2005 | Lee et al. |
| 2005/0052915 | A1 | 3/2005 | Herner et al. |
| 2005/0255581 | A1 | 11/2005 | Kim et al. |
| 2006/0046379 | A1 | 3/2006 | Symanczyk et al. |
| 2006/0204794 | A1 | 9/2006 | Kikuchi et al. |
| 2006/0250836 | A1 | 11/2006 | Herner et al. |
| 2006/0250837 | A1 | 11/2006 | Herner et al. |
| 2007/0072360 | A1 | 3/2007 | Kumar et al. |
| 2007/0164309 | A1 | 7/2007 | Kumar et al. |
| 2008/0013364 | A1 | 1/2008 | Kumar et al. |
| 2008/0025067 | A1* | 1/2008 | Scheuerlein et al. ......... 365/148 |

FOREIGN PATENT DOCUMENTS

| | | | |
|---|---|---|---|
| WO | WO 03/046265 | A2 | 6/2003 |

OTHER PUBLICATIONS

U.S. Appl. No. 11/819,078, filed Jun. 25, 2007, Herner.
U.S. Appl. No. 11/864,532, filed Sep. 28, 2007, Maxwell et al.
U.S. Appl. No. 12/007,780, filed Jan. 15, 2008, Herner et al.
U.S. Appl. No. 12/007,781, filed Jan. 15, 2008, Dunton et al.
Li, A. P. et al, "Polycrystalline and Monocrystalline Pore Arrays with Large Interpore Distance in Anodic Alumina", Electrochemical and Solid State Letters, vol. 3, No. 3, 2000, pp. 131-134.
Li, A. P. et al., "Hexagonal Pore Arrays with a 50-420 nm Interpore Distance Formed by Self-Organization in Anodic Alumina", Journal of Applied Physics, vol. 84, No. 11, Dec. 1998, pp. 6023-6026.
Li, An-Ping et al., "Fabrication and Microstructuring of Hexagonally Ordered Two-Dimensional Nanopore Arrays in Anodic Alumina", Advanced Materials, 5 pgs., vol. 11, No. 6, Apr. 1999, pp. 483-487.
Liu, Nai-Wei et al., "Fabrication of Anodic-Alumina Films with Custom-Designed Arrays of Nanochannels", Advanced Materials, vol. 17, No. 2, Jan. 2005, pp. 222-225.
Sander, Melissa S. et al., "Nanoparticle Arrays on Surfaces Fabricated Using Anodic Alumina Films as Templates", Advanced Functional Materials, vol. 13, No. 5, May 2003, pp. 393-397.
International Preliminary Report on Patentability issued in PCT Application PCT/US2009/058151, mailed on Apr. 14, 2011.

* cited by examiner

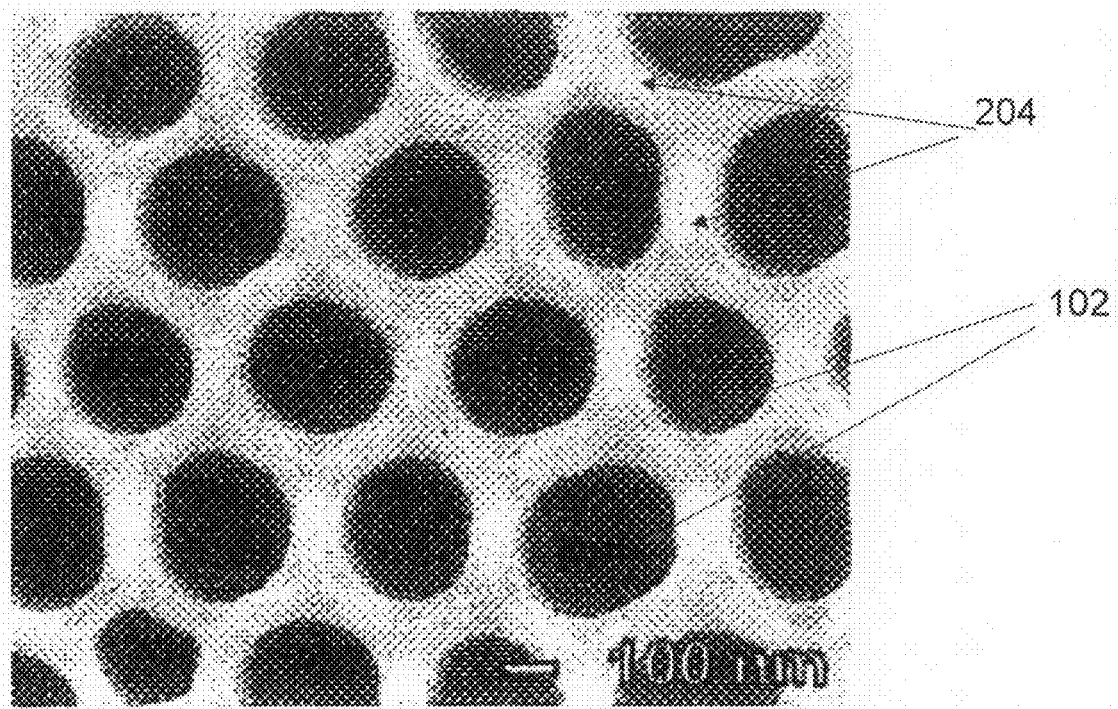
Figure 1C
Prior Art
Figure 1D
Prior Art
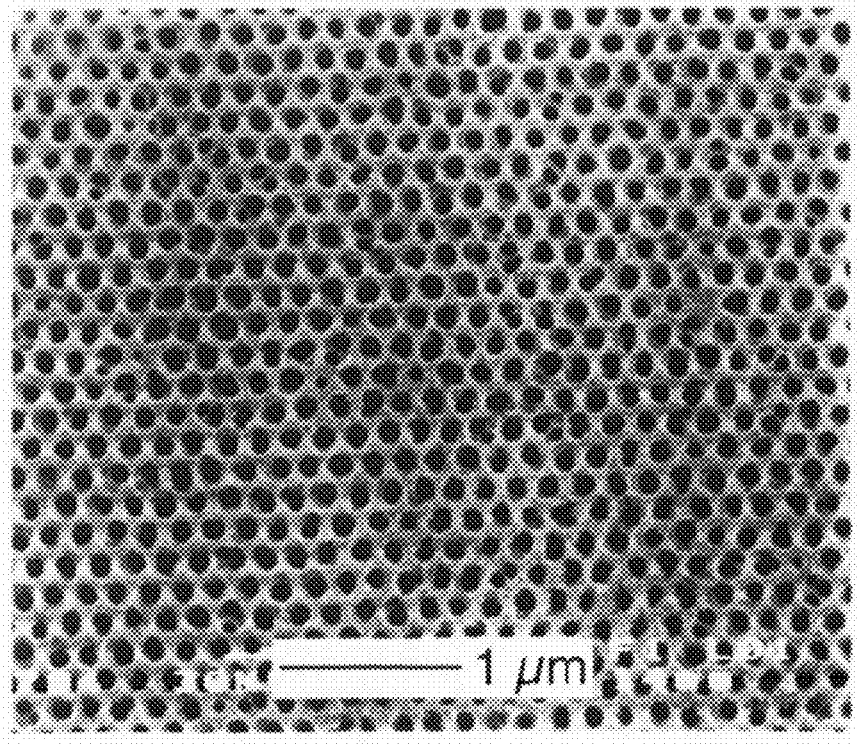

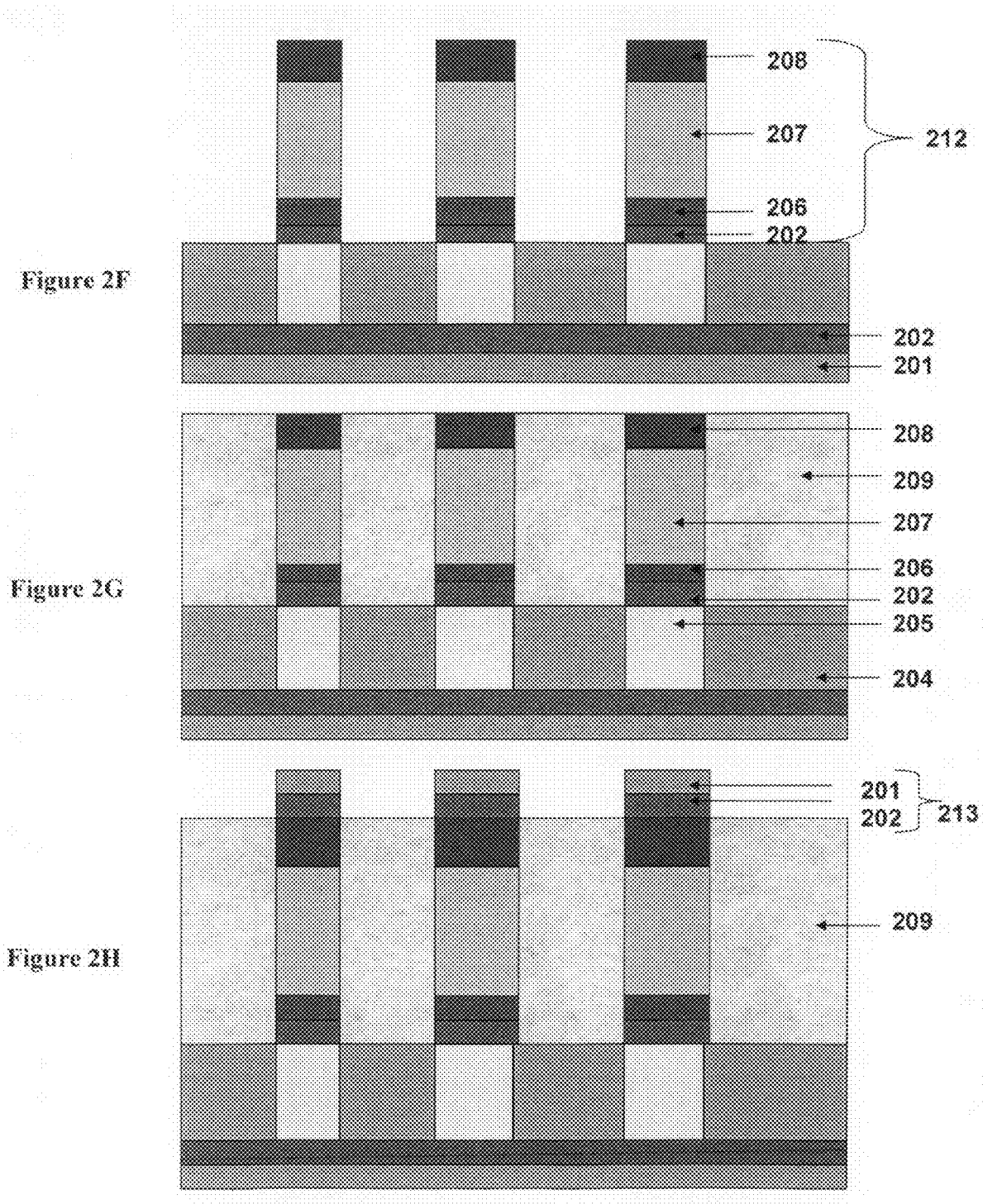

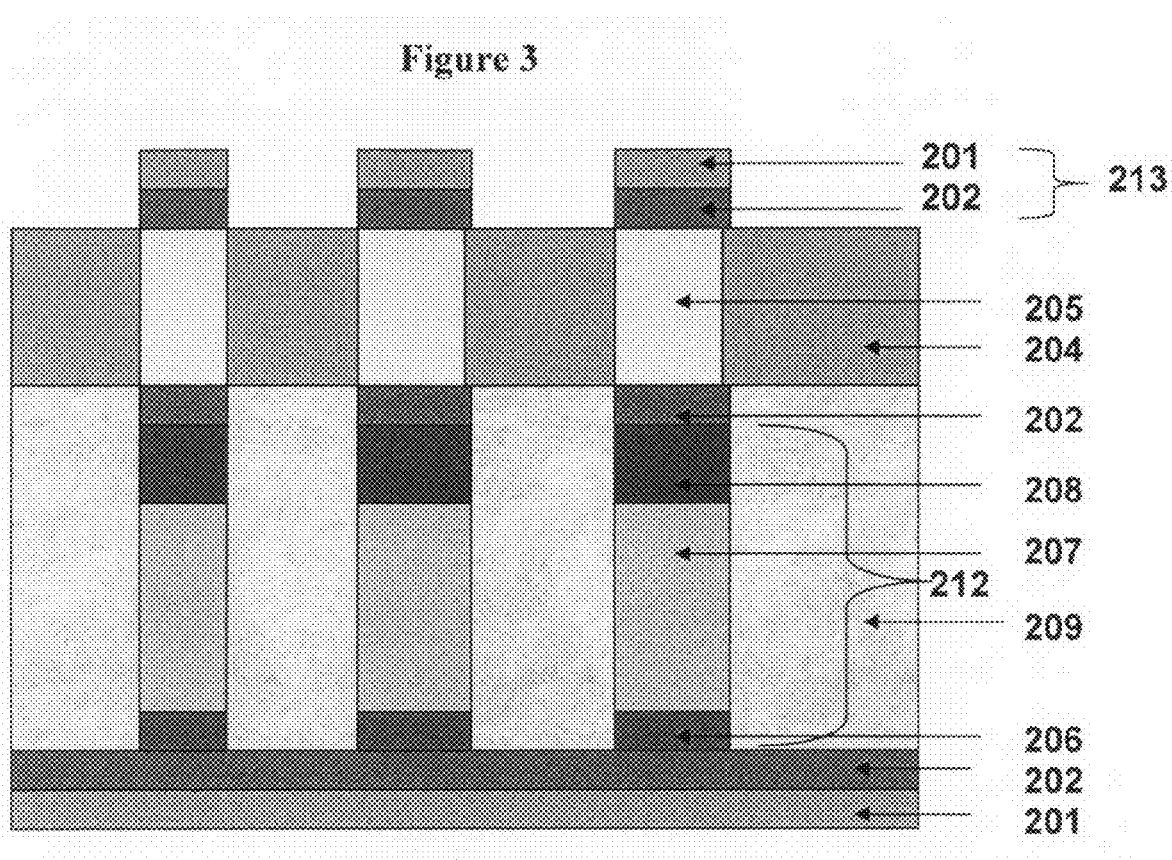

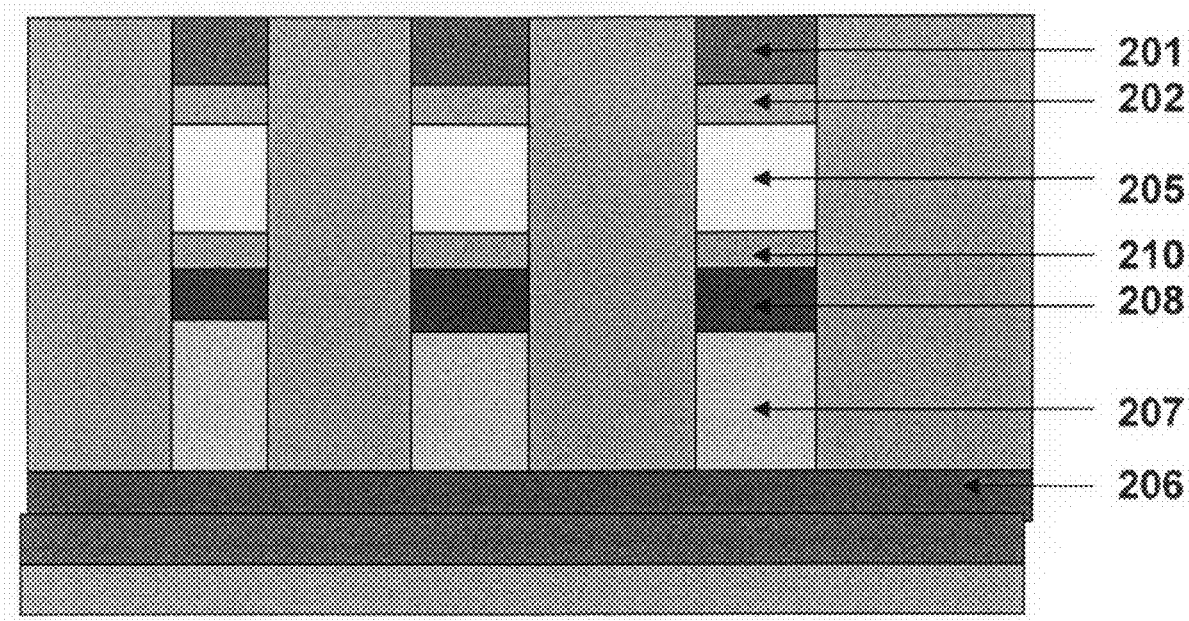

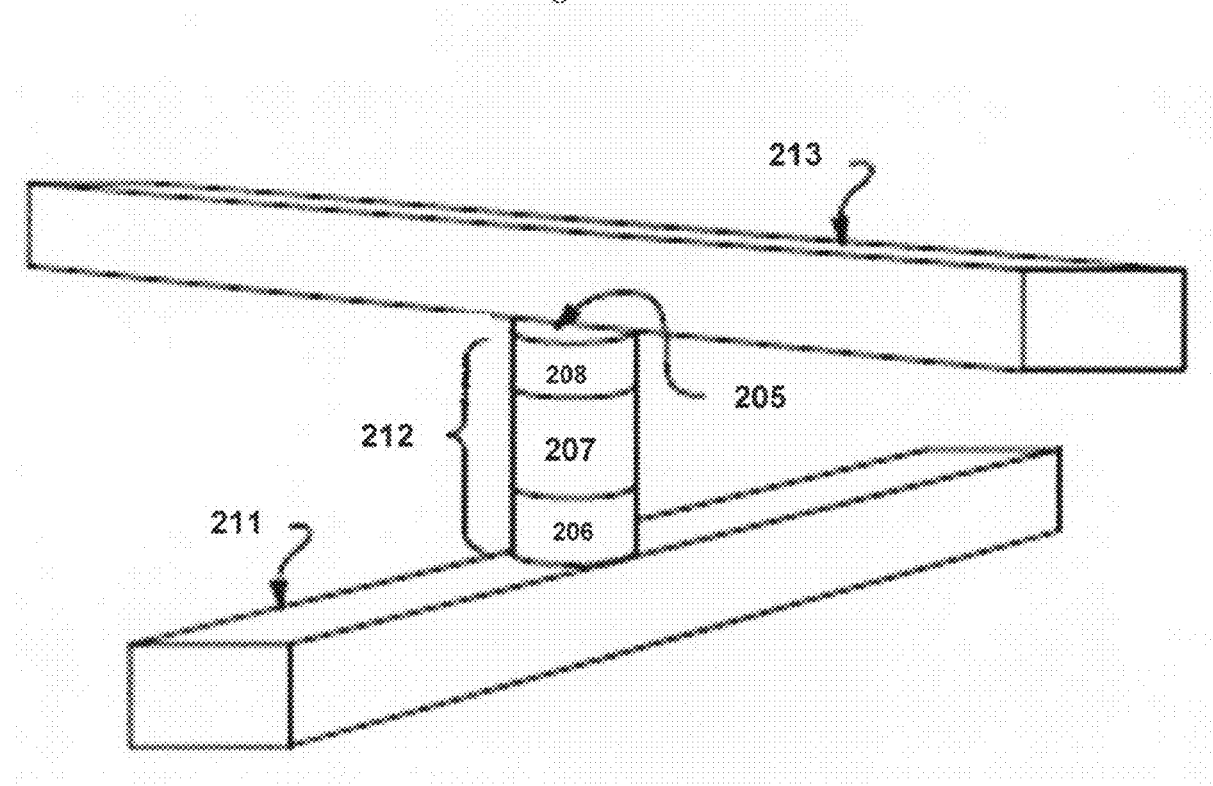

SELF-ASSEMBLY PROCESS FOR MEMORY ARRAY

FIELD OF INVENTION

The present invention relates generally to the field of semiconductor device processing, and specifically to non-volatile memory devices and methods of making same.

BACKGROUND

Herner et al., U.S. patent application Ser. No. 10/955,549, filed Sep. 29, 2004 (which corresponds to US Published Application 2005/0052915 A1), hereby incorporated by reference, describes a three dimensional memory array in which the data state of a memory cell is stored in the resistivity state of the polycrystalline semiconductor material of a pillar shaped semiconductor junction diode. A subtractive method is used to fabricate such pillar diode devices. This method includes depositing one or more silicon, germanium or other semiconductor material layers. The deposited semiconductor layer or layers are then etched to obtain semiconductor pillars. A $SiO_2$ layer can be used as a hard mask for the pillar etching and removed afterwards. Next, $SiO_2$ or other gap fill dielectric material is deposited in between and on top of the pillars. A chemical mechanical polishing (CMP) or etchback step is then conducted to planarize the gap fill dielectric with the upper surface of the pillars.

For additional description of the subtractive pillar fabrication process, see Herner et al., U.S. patent application Ser. No. 11/015,824, "Nonvolatile Memory Cell Comprising a Reduced Height Vertical Diode," filed Dec. 17, 2004 and U.S. patent application Ser. No. 11/819,078 filed Jun. 25, 2007. However, in the subtractive method, the height of the semiconductor pillar may be limited by thin and soft photoresist used as the etching mask. The photoresist mask material etches at a slower rate than the semiconductor material, but etches nonetheless, and some mask material must remain when the semiconductor etch is completed. The oxide gap filling step after pillar etching presents a processing challenge when the aspect ratios of the openings between the pillars increase and/or the CMP process or etchback of the gap fill layer removes a significant thickness of the deposited semiconductor material.

SUMMARY

One embodiment that provides a method of making a device includes forming at least one anodizable metal layer over at least one of an electrode or a semiconductor device, forming a plurality of pores in the anodizable metal layer by anodization of the anodizable metal layer to expose a portion of the electrode or semiconductor device, and filling at least one pore with a rewritable material such that at least some of the rewritable material is in electrical contact with the electrode or semiconductor device.

In another embodiment, a method of making a device comprises forming a first semiconductor layer of a first conductivity type over a substrate, forming an anodizable metal layer over the first semiconductor layer, forming a plurality of pores in the anodizable metal layer by anodization of the anodizable metal layer, wherein the pores expose the first semiconductor layer of the first conductivity type, and forming a second semiconductor material in the plurality of pores in contact with the exposed first semiconductor layer.

Another embodiment of the invention provides a memory device, comprising a diode steering element and a rewritable memory material, wherein at least one of the diode and the rewritable memory material is embedded in anodized alumina dielectric.

BRIEF DESCRIPTION OF THE DRAWINGS

FIGS. 1A-1D provide scanning electron microscopy (SEM) images of prior art anodized alumina layers containing nanopores.

FIGS. 2A-2H illustrate schematic side cross sectional views of steps in a method of forming non-volatile memory cells in nanopores according to one embodiment of the invention in which the rewritable memory material of the storage element is at the bottom of the cell.

FIG. 3 is a schematic side cross sectional view of a structure of an alternative embodiment where the rewritable memory material is located on top of the cell.

FIG. 5 is a schematic side cross sectional view of a structure of another alternative embodiment where the upper electrode is formed by titanium nitride/tungsten deposition followed by CMP.

FIG. 7 is perspective view of a memory cell formed according to an embodiment of the present invention.

DETAILED DESCRIPTION OF THE EMBODIMENTS

One embodiment of the invention provides a method of making a non-volatile memory cell in which the rewritable memory material of the storage element of the cell is formed in nanopores of an anodized metal layer. Optionally, the steering element of the cell, such as a diode, can also be formed in the same or different nanopores of the same or different anodized metal layer. The memory cell may comprise a portion of a three-dimensional memory array.

The anodizable metal layer can comprise any anodizable metal, such as aluminum. However, other suitable metals, such as niobium, etc., may also be used. Anodization is generally known in the art; see for example Li et al, *Journal of Applied Physics* Vol. 84 (3), page 6023 (1998) and see Li et al, *Electrochemical and Solid-State Letters*, Vol. 3 (3) page 131 (2000), both of the which are incorporated herein by reference in their entirety. In one embodiment, the anodization of aluminum can be carried out in a solution comprising oxalic acid, sulfuric acid, phosphoric acid, or combinations thereof, under a substantially constant electrical potential. Other anodization solutions may also be used. The anodization of the metal layer forms a metal oxide layer containing nanopores, such as an aluminum oxide (i.e., alumina) layer containing an array of nanopores. In one embodiment, as shown in FIGS. 1A-1D, self-organized arrays of nanopores 102 may be formed in the alumina layer 204. The nanopores 102 may have an interpore distance of about between about 20 nm and about 600 nm, such as between about 50 nm and about 420 nm. The pores can have a diameter of about 100 nm or less, such as about 50 nm to 100 nm. Further, the nanopores can have a high aspect ratio of greater than 100, such as greater than about 500, such as greater than 700, for example an aspect ratio of 100 to 1000. The nanopores can have any shape, such as a substantially circular or a hexagonal shape. The nanopores 102 may be arranged in a substantially hexagonal array having an equilateral triangle as a basic unit cell and having a large unit cell six pores arranged at vertices of a hexagon with a seventh pore located in the middle of the hexagon.

The anodizable metal layer can be formed over an electrode or over a semiconductor device (such as a steering element of the memory cell), as shown in FIGS. 2A-2H and FIG. 3, respectively. The electrode or semiconductor device are formed over a substrate (not shown for clarity). The substrate can be any semiconductor substrate known in the art, such as monocrystalline silicon, IV-IV compounds such as silicon-germanium or silicon carbide, III-V compounds, II-VI compounds, epitaxial layers over such substrates, or any other semiconductor or non-semiconductor material, such as glass, plastic, metal or ceramic substrate. The substrate may include integrated circuits fabricated thereon, such as driver circuits and/or electrodes for a memory device.

Figure 1A:
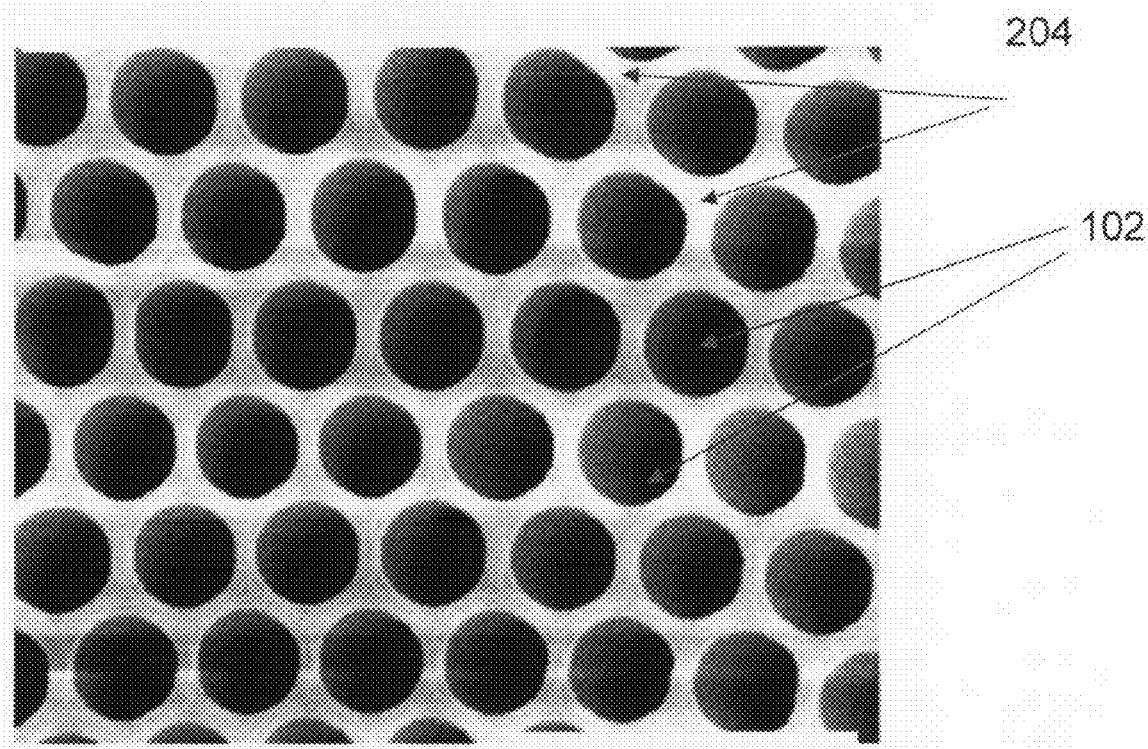
Figure 1B:
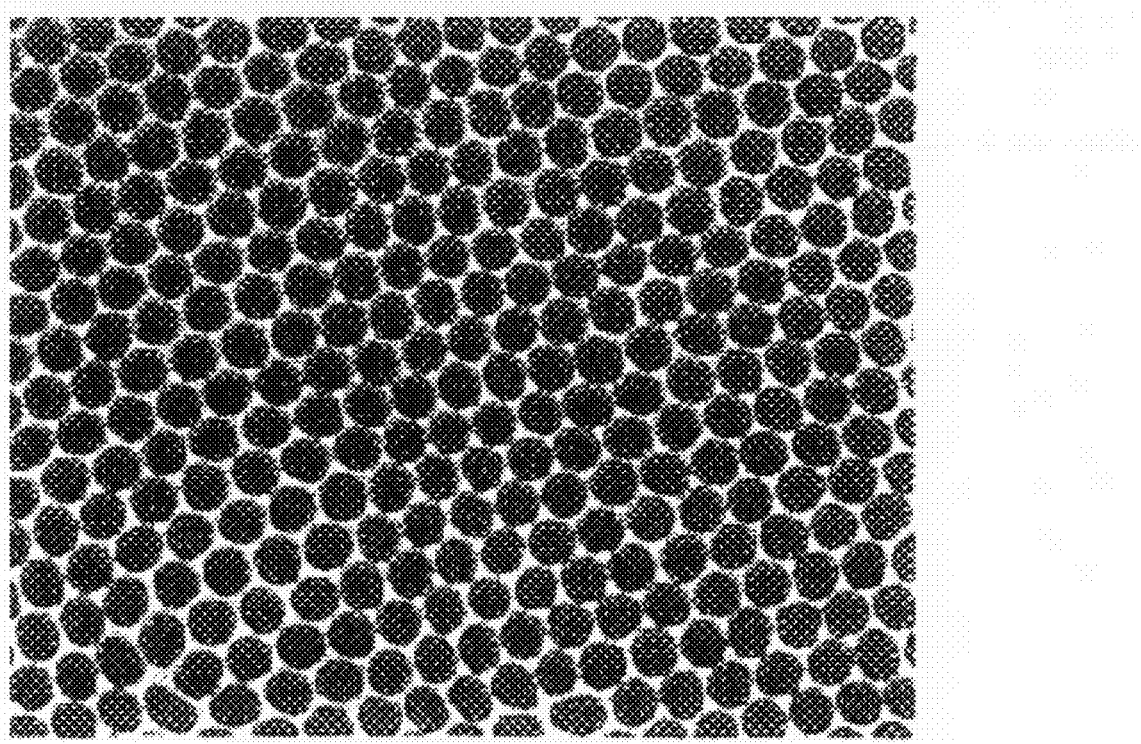
Figure 2A:
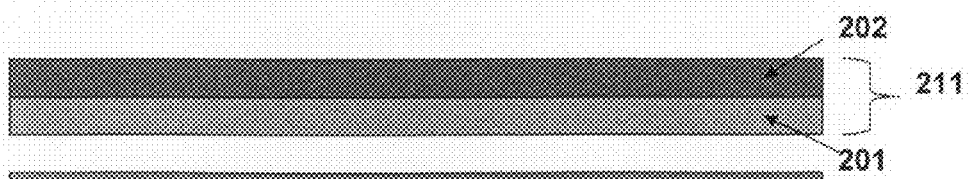
Figure 2B:
Figure 2C:
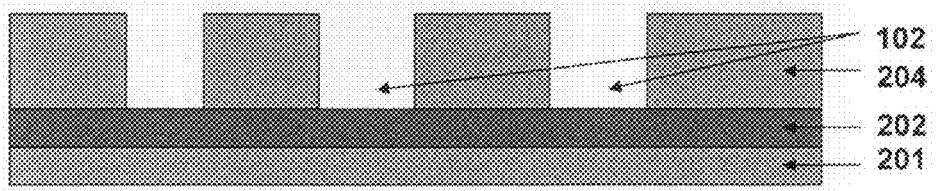

In the embodiment shown in FIGS. 2A-2H, the anodizable metal layer, such as an aluminum layer 203 is formed over the electrode 211. The electrode 211 may comprise a conductive layer 201, such as tungsten, and an adhesion or barrier layer 202, such as titanium nitride, as shown in FIG. 2A. Other conductive materials may also be used. The aluminum layer 203 is then formed over the electrode 211 as shown in FIG. 2B. The aluminum layer 203 is anodized to convert it to an anodized alumina 204 layer containing the nanopores 102, as shown in FIG. 2C.

Figure 2D:
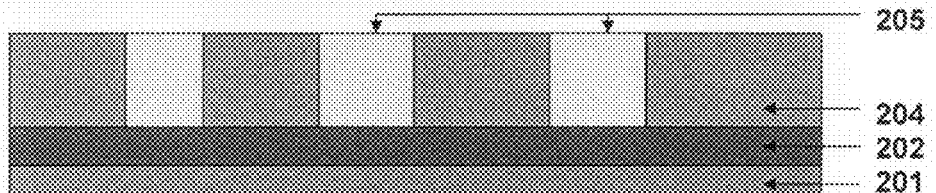

Then, as shown in FIG. 2D, the storage element 205 of each memory cell, which can be referred to as "resistivity switching material" or "rewritable memory material," can be formed or provided in the nanopores 102 in the anodized alumina layer 204. In one embodiment, the nanopores 102 of the anodized alumina layer 204 are filled in such a way that at least some of the rewritable memory material 205 is in electrical contact with the electrode 211 exposed in the pores below the alumina layer 204. The rewritable memory material can comprise antifuse dielectric, fuse material, metal oxide or switchable complex metal oxide layer, carbon nanotube material, graphene resistivity switchable material, carbon resistivity switchable material, phase change material memory, conductive bridge element, or switchable polymer memory material. The element or material 205 may be selectively grown on the electrode 211 material exposed in the nanopores 102 or it may be deposited non-selectively in the nanopores 102 and over the alumina layer 204 followed by planarization by chemical mechanical polishing (CMP) or etchback.

Figure 2E:
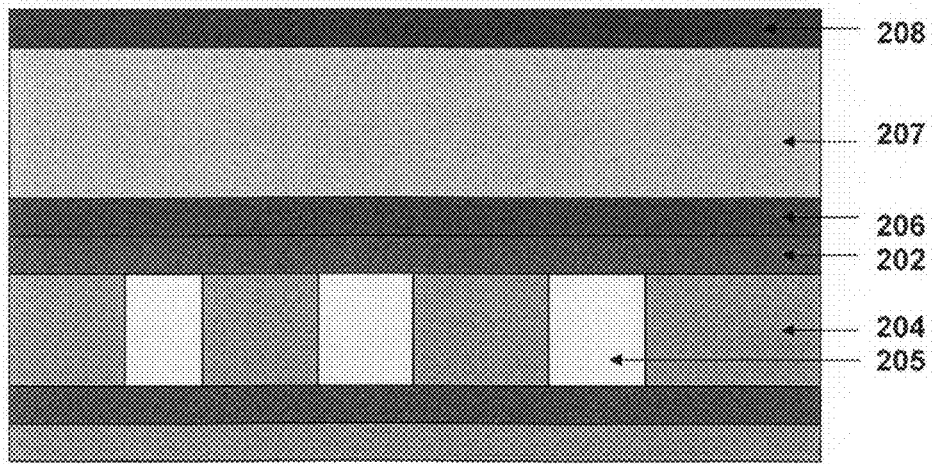

Then, the steering element, such as a diode, of each memory cell is formed over the storage element 105. In one embodiment, the steering element may also be formed in the same nanopore 102 as each storage element 105. In another embodiment shown in FIGS. 2E-2F, the diode steering element is formed by patterning several semiconductor layers. Specifically, as shown in FIG. 2E, to form a p-i-n diode steering element, a first semiconductor layer 206 of a first conductivity type (such as n-type) is formed over the alumina layer 204 and in contact with the storage elements 205 exposed in the nanopores 102, a second intrinsic semiconductor layer 207 is formed over the first layer 206, and a third semiconductor layer 208 of a second conductivity type (such as p-type) is formed over the second layer 207.

The third semiconductor layer can be formed by implanting second conductivity type dopants, such as p-type dopants, into the upper portion of the intrinsic semiconductor layer 207 by ion implantation to form a second conductivity type (such as p-type) region 208 of the p-i-n diode. Alternatively, the second conductivity type region 208 of the p-i-n diode can be formed by depositing a semiconductor layer of second conductivity type over the intrinsic semiconductor layer 207. The position of the p-type and n-type layers or regions can be reversed if desired. To form a p-n type diode, the second conductivity type (such as p-type) semiconductor can be formed directly over the first conductivity type semiconductor material to form the diode. Any semiconductor materials, such as silicon, germanium, silicon germanium, or other compound semiconductor materials, may be used for layers 206, 207 and 208. These materials may be single crystalline, polycrystalline or amorphous.

In one embodiment, an optional conductive barrier layer 202, such as a titanium nitride layer may be formed between the alumina layer 204 and the first semiconductor layer 206 of the first conductivity type.

Then, as shown in FIG. 2F, the semiconductor layers 206, 207 and 208 as well as the optional barrier layer 202 are photolithographically patterned (i.e., masked and etched) to form pillar shaped diode steering elements 212 of each memory cell. The diode 212 of each memory cell is aligned with the storage element 205 of each cell. A gap fill insulating layer 209, such as a silicon oxide, silicon nitride or other insulating material is formed between the pillar diodes 212, as shown in FIG. 2G. Layer 209 may be formed between and over the diodes 212 and then planarized by CMP or etchback to expose the top of the diodes 212. Finally, as shown in FIG. 2H, the upper electrodes 213 for each memory cell are formed in contact with the top of the diodes. The electrodes 213 may also comprise the tungsten 201 and TiN 202 layers. The electrodes 213 may be formed by photolithographic patterning and etching of layers 201 and 202 to form rail shaped electrodes which extend in a different direction (such as in and out of the page in FIG. 2H) from the direction of bottom electrodes 211. This completes the non-volatile memory device.

In an alternative embodiment shown in FIG. 3, the anodizable metal layer 203 is formed over a semiconductor device, such as the diode steering elements 212. In this embodiment, the diodes 212 are formed first over the bottom electrodes 211 using the method described above with respect to FIGS. 2E and 2F. The aluminum layer 203 is formed over the diodes 212, followed by anodization and formation of the storage elements 205 in the nanopores 102 using the method described above with respect to FIGS. 2B-2D. The upper electrodes 213 are then formed over the rewritable memory material of the storage elements 205.

Figure 4A:
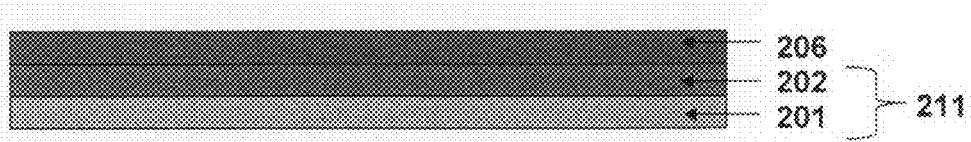
FIGS. 4A-4I illustrate schematic side cross sectional views of steps in a method of forming non-volatile memory cells in nanopores according to an alternative embodiment of the invention.
Figure 4B:
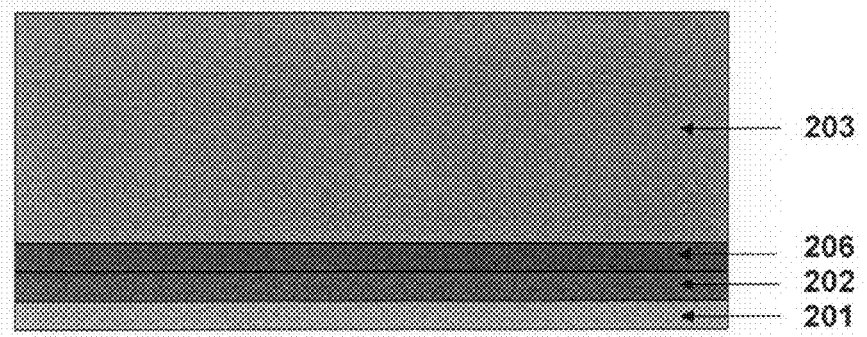
Figure 4C:
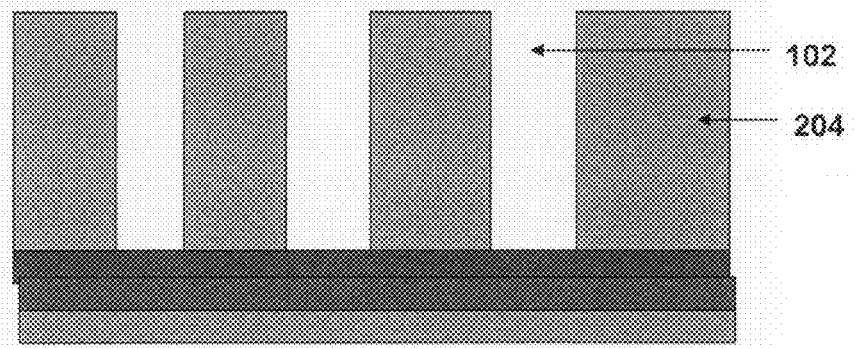

FIGS. 4A-4I illustrate another alternative embodiment of the invention where upper portions of the diodes 212, such as diode steering elements of a non-volatile memory device, are formed in nanopores while the lower portions of the diodes are formed below the nanopores. As shown in FIG. 4A, the bottom electrodes 211 are formed over the substrate. Then, the first semiconductor layer 206 of the first conductivity type (such as n-type) is formed over the electrodes 211, as shown in FIG. 4B. The anodizable metal layer 203 is formed over the first semiconductor layer 206 and the plurality of nanopores 102 are formed in the anodizable metal layer 203 by anodization of the anodizable metal layer to convert layer 203 to the anodized layer 204, such as the alumina layer, as shown in FIG. 4C. The nanopores 102 expose the first semiconductor layer 206 of the first conductivity type.

Figure 4D:
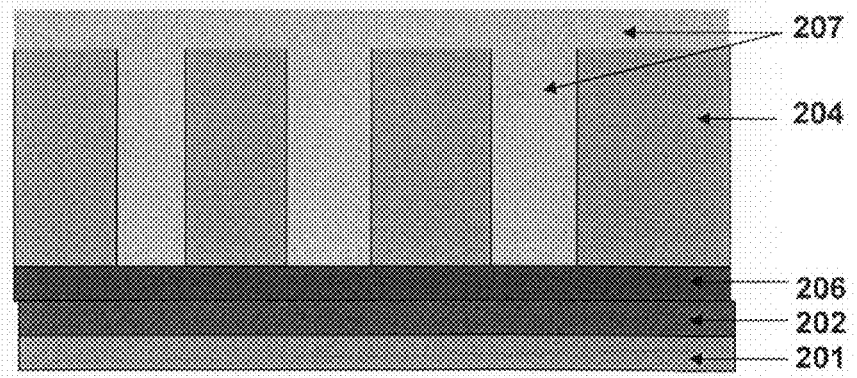

A second semiconductor material is formed in the plurality of nanopores 102 in contact with the exposed first semiconductor layer 206, as shown in FIG. 4D. For the p-i-n diodes 212, the second semiconductor material comprises an intrinsic semiconductor material 207 formed in the pores in the contact with the exposed first semiconductor layer 206 and a semiconductor material 208 of a second conductivity type (such as p-type) formed over the intrinsic semiconductor material to form the plurality of p-i-n diodes 212, as shown in FIGS. 4E and 4F.

Figure 4E:
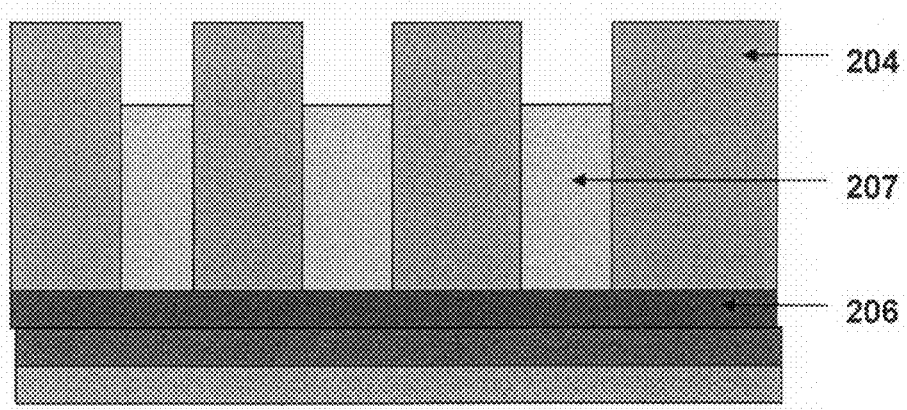
Figure 4F:
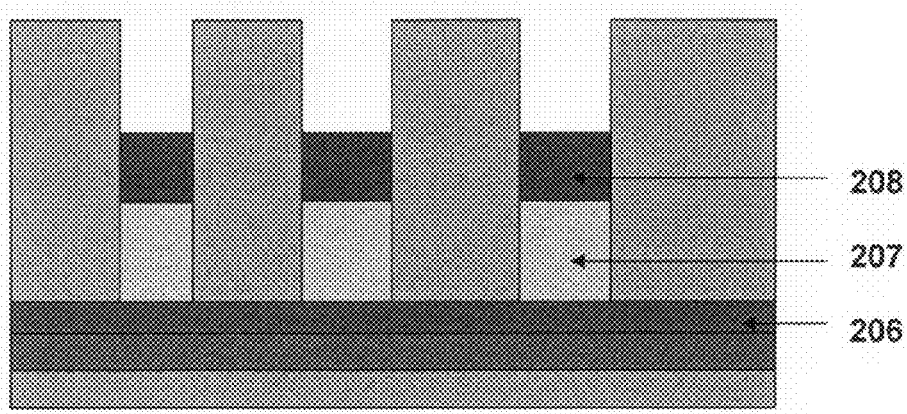

The intrinsic semiconductor material 207 can be formed in the pores by depositing an intrinsic semiconductor layer into the pores 102 and over the upper surface of the anodized metal layer 204, planarizing the deposited intrinsic semiconductor layer 207, and etching an upper portion of the intrinsic semiconductor layer 207 to recess the intrinsic semiconductor layer below the surface of the anodized metal layer, as shown in FIGS. 4D and 4E and as described in U.S. application Ser. No. 12/007,781 filed on Jan. 15, 2008 and incorporated herein by reference in its entirety. Alternatively, material 207 may be formed by selectively growing the intrinsic semiconductor material in the nanopores 102 on exposed first layer 206 as described in U.S. application Ser. No. 12/007,780 filed on Jan. 15, 2008 and incorporated herein by reference in its entirety.

The semiconductor material 208 of the second conductivity type may be formed by doping an upper portion the intrinsic semiconductor material 207 with dopants of the second conductivity type (such as p-type) using diffusion or ion implantation, as shown in FIG. 2F. Alternatively, material 208 may be formed by depositing a semiconductor layer of the second conductivity type into the pores 102 and over the upper surface of the anodized metal layer 204, planarizing the deposited semiconductor layer of the second conductivity type, followed by optionally recessing material 208 in the pores 102.

In one embodiment, the rewritable memory material is an antifuse dielectric layer, and the step of forming a rewritable memory material layer 205 can be a step of oxidation of an upper portion of a second semiconductor layer 208, such as polysilicon, of the diode 212. Alternatively, the step of forming the rewritable memory material 205 can comprise depositing an antifuse dielectric layer using a method such as high-pressure ionized chemical vapor deposition, or any other method suitable for depositing dielectric materials followed by suitable planarization or etchback.

Figure 4G:
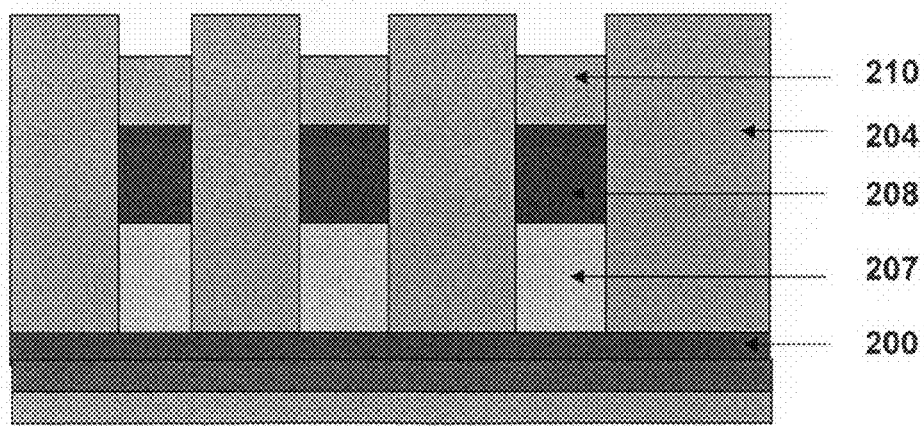

An optional barrier layer 210, such as a metal silicide can optionally be formed prior to forming the rewritable memory material, as shown in FIG. 4G. The barrier layer 210 can comprise titanium, cobalt, nickel or silicides thereof, titanium nitride, tantalum, tantalum nitride, titanium tungsten, tungsten nitride, or combinations thereof. For example, the barrier layer 210 can comprise a metal silicide, such as titanium silicide or nickel silicide. The silicidation process can be a self-aligned process comprising forming titanium or nickel in the nanopores on silicon material 208 followed by annealing to form the silicide barrier 210.

Figure 4H:
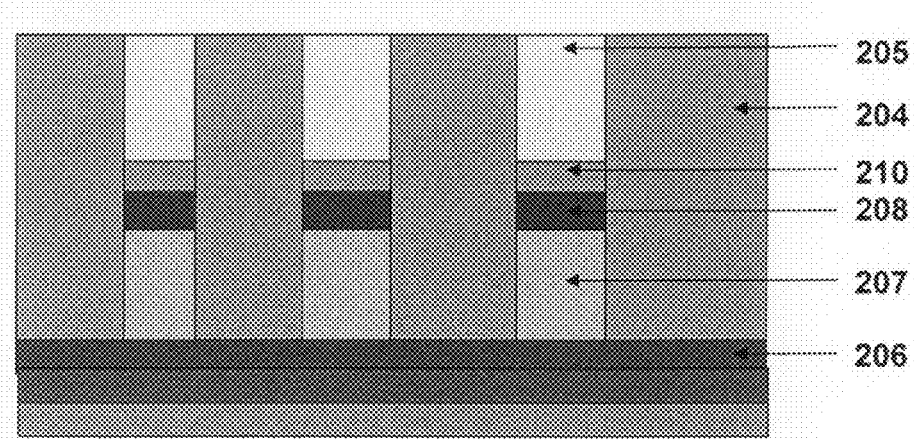

The storage element 205 is then formed in the nanopores 102 over the barrier layer 210, as shown in FIG. 4H. The same method may be used to form element 205 as that described above with respect to FIG. 2D above.

Figure 4I:
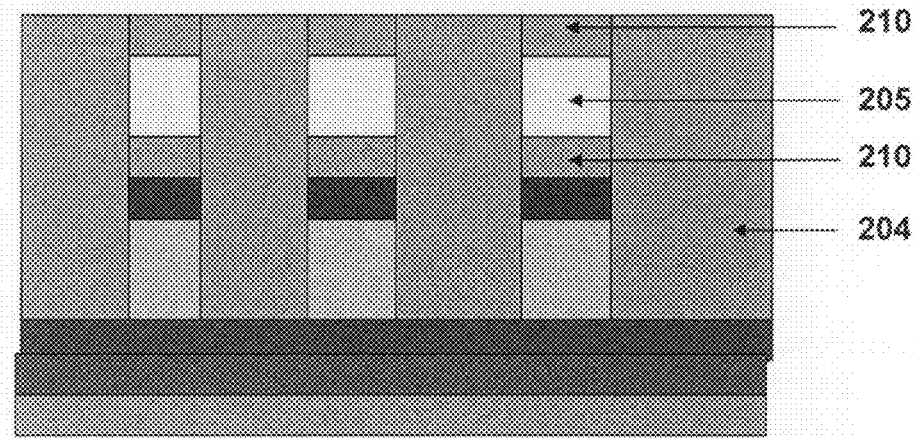

Further, another optional barrier layer 210 can be formed over the rewritable memory material of the storage element 205, as shown in FIG. 4I. The upper electrode 213 is then formed over the rewritable memory material 205 as described above with respect to FIG. 2H.

In an alternative embodiment shown in FIG. 5, the upper electrode 213 is formed by depositing tungsten and/or titanium nitride layers 201, 202 in the nanopores 102 followed by chemical mechanical polishing (CMP) or other planarization steps. Other electrode materials may also be used. As shown in FIGS. 4I and 5, the diodes 212 include a continuous first semiconductor layer 206 which connects all of the diodes 212, and separate intrinsic 207 and second semiconductor layers 208 which are located in the nanopores. The first semiconductor layer 206 may be continuous in three dimensions or it may be patterned into rails together with the lower electrodes 211 such that each lower electrode 211 and each respective portion of layer 206 form a plurality of rails which are separated by a gap fill insulating layer, such as silicon oxide, etc.

FIGS. 6A-6H illustrate a method according to another alternative embodiment of the invention in which both the storage and steering elements of each memory cell are formed in separate but connected nanopores in vertically stacked alumina layers.

Figures 6A, 6B, 6C, 6D:
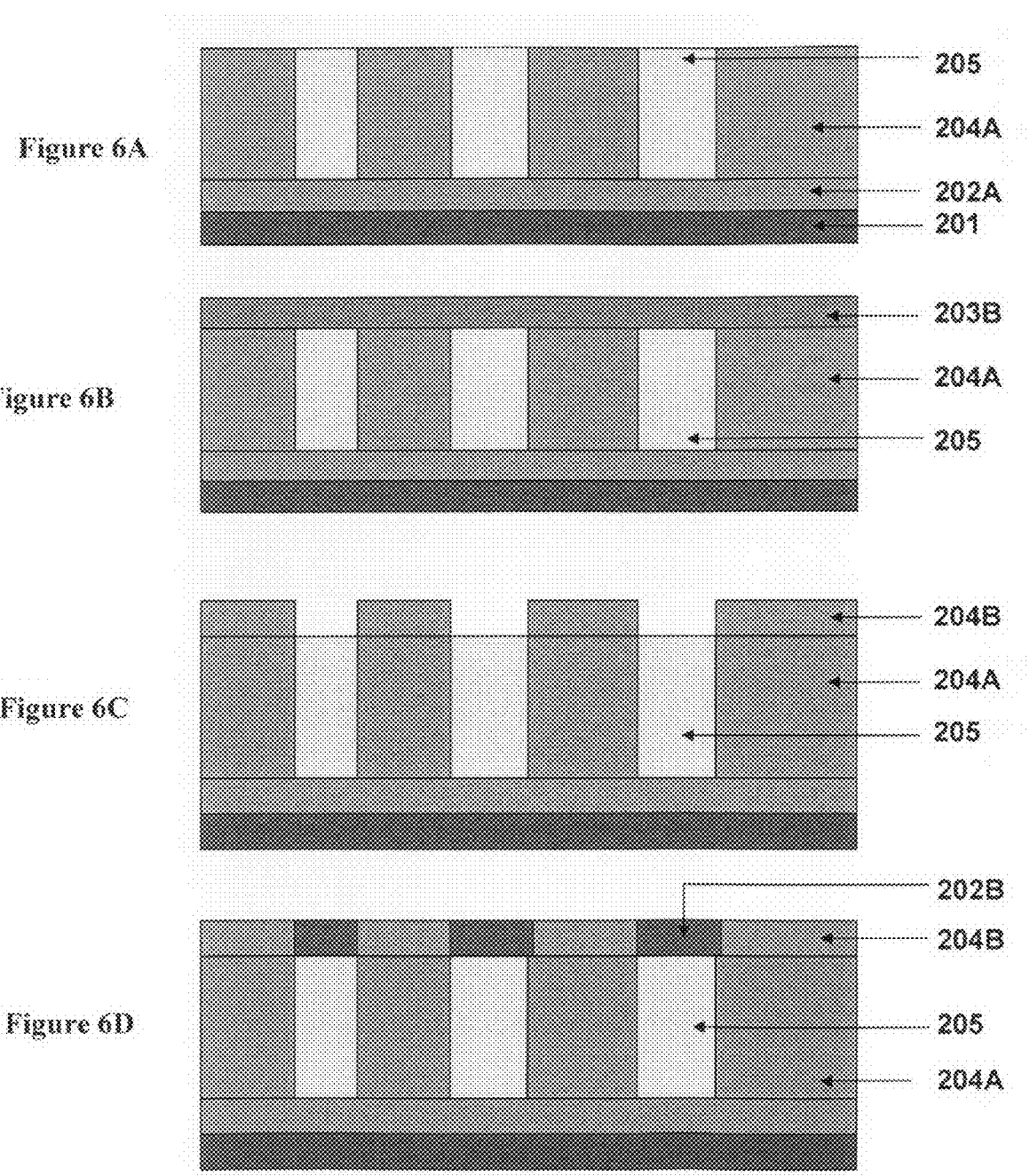
FIGS. 6A-6H illustrate schematic side cross sectional views of steps in a method of forming non-volatile memory cells in nanopores according to another alternative embodiment of the invention.

As shown in FIG. 6A, the rewritable memory material of the storage element 205 is formed in the first plurality of nanopores in the first or lower alumina layer 204A over the lower electrode layers 201 and 202A using the method described above and illustrated in FIGS. 2A to 2D. Then, as shown in FIG. 6B, an optional second anodizable metal layer 203B, such as an aluminum layer, is formed over the first anodized metal layer (i.e., alumina layer) 204A after filling the nanopores in the first anodized layer 204A with the rewritable material 205.

As shown in FIG. 6C, a plurality of nanopores are formed in the second anodizable metal layer 203B by anodization of the second anodizable metal layer to form an optional second anodized layer 204B. As shown in FIG. 6D, an optional barrier layer 202B, such as TiN barrier layer, is formed in the nanopores in layer 204B.

Figure 6E:
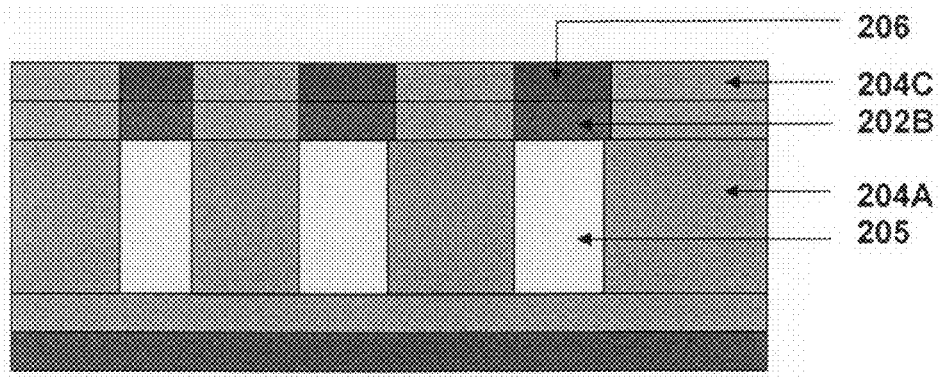

A third anodizable metal layer, such as an aluminum layer, is formed over the second anodized metal layer (i.e., alumina layer) 204B after filling the nanopores in the second anodized layer 204B with the barrier material 202B. If layer 204B is omitted, then the third anodizable metal layer is formed directly on layer 204A. Then, as shown in FIG. 6E, a plurality of nanopores are formed in the third anodizable metal layer by anodization of the third anodizable metal layer to form a third anodized layer (i.e., alumina layer) 204C. As shown in FIG. 6E, the first semiconductor material 206 of the first conductivity type is formed in the nanopores in layer 204C.

Figure 6F:
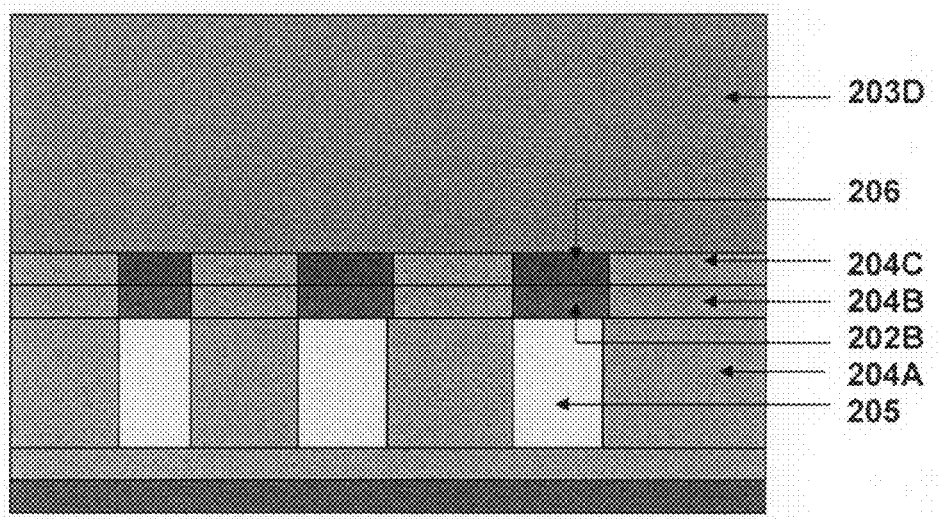
Figure 6G:
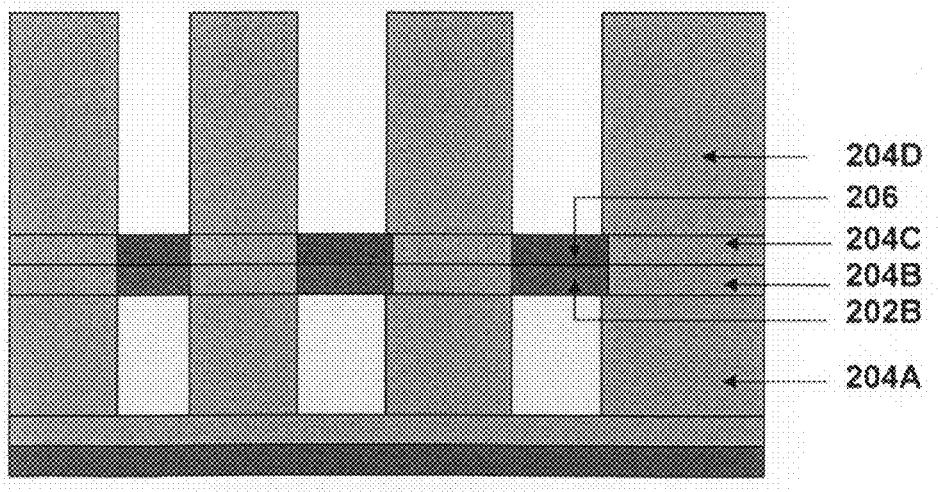
Figure 6H:
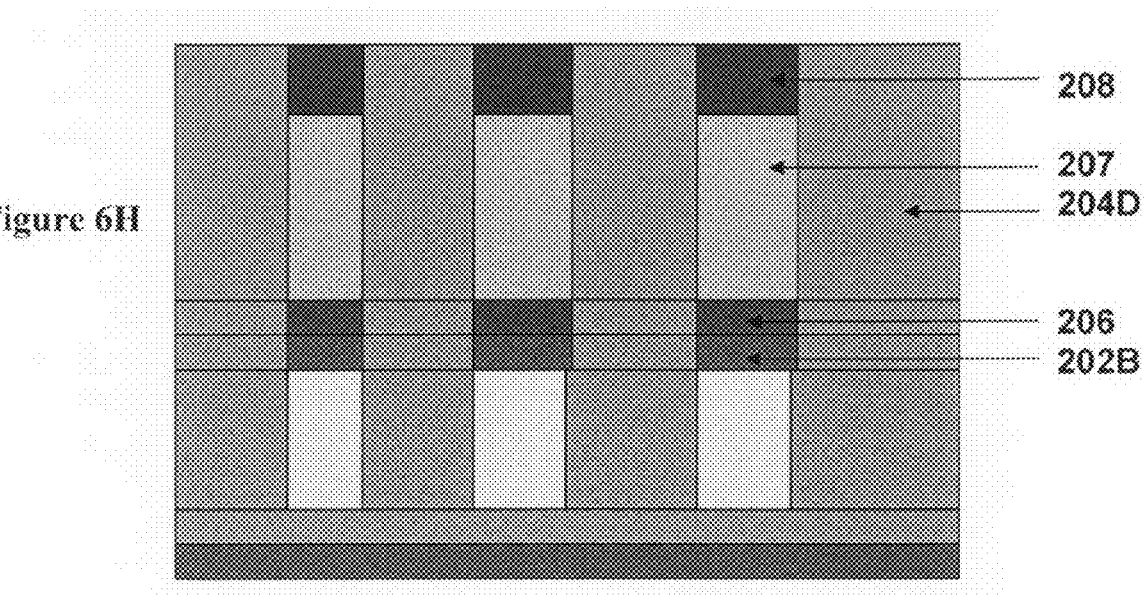

A fourth anodizable metal layer 203D, such as an aluminum layer, is formed over the third anodized metal layer (i.e., alumina layer) 204C after filling the nanopores in the third anodized layer 204C with the semiconductor material 206, as shown in FIG. 6F. Then, a plurality of nanopores are formed in the fourth anodizable metal layer 203D by anodization of the fourth anodizable metal layer to form a fourth anodized layer (i.e., alumina layer) 204D, as shown in FIG. 6G. The intrinsic semiconductor material 207 and the second semiconductor material 208 of the second conductivity type are formed in the nanopores in layer 204D, as shown in FIG. 6H. Semiconductor material 207 and 208 may be formed using the methods described above with respect to FIGS. 4E and 4F. For example, the step of forming the second conductivity type semiconductor region 208 of the diode 212 comprises forming an intrinsic semiconductor region 207 in the at least one pore in the fourth anodized metal layer 204D and doping an upper portion of the intrinsic semiconductor region with dopant of the second conductivity type. Then, the upper electrode 213 may be formed over the completed device using the methods described above with respect to FIGS. 2H, 3 and 5. Thus, the p-i-n diode 212 is formed in at least one pore in at least one additional anodized metal layer such that the p-i-n diode electrically contacts the rewritable material 205. If desired, the intrinsic region 207 of the diode 212 may be omitted to form a p-n diode.

In the above described embodiment, the rewritable memory material 205 is formed first, and the diodes 212 are formed over the rewritable memory material 205. Alternatively, in an alternative embodiment, the diodes 212 are formed first using the method described above with respect to FIGS. 6E-6H and the rewritable memory material 205 is formed over the rewritable memory material using the method described above with respect to FIG. 6A. In other words, layer 204A is formed over layers 204C and 204D, with the optional layer 204B containing the barrier material 202B is optionally formed above layer 204D and below layer 204A. Furthermore, while the above described embodiments illustrate forming semiconductor region 206 in nanopores in one alumina layer 204C and forming the semiconductor regions 207 and 208 in nanopores in a different alumina layer 204D, all semiconductor regions of the diode can be formed in the same nanopores in one alumina layer.

FIG. 7 illustrates one cell of memory device, comprising a diode steering element 212 and a rewritable memory material 205. At least one of the diode and the rewritable memory material is embedded in anodized alumina dielectric. The diode can be a p-i-n diode, and the position of the p-type and n-type regions can be reversed if desired. In one embodiment shown in FIGS. 6A-6H, both the diode and the rewritable memory material are embedded in the anodized alumina dielectric. In other embodiments, only one of the rewritable memory material and the diode is embedded in the alumina dielectric.

The memory cell can be further located in a monolithic three dimensional array of memory cells. The memory cell can be a read/write memory cell or a rewritable memory cell. The memory cell type can be selected from at least one of antifuse, fuse, polysilicon memory effect cell, metal oxide memory, switchable complex metal oxide, carbon nanotube memory, graphene, amorphous or polycrystalline carbon switchable resistance material, phase change material memory, conductive bridge element, or switchable polymer memory. U.S. application Ser. Nos. 11/864,532 and 11/819,595, U.S. Published Application Numbers US 2007/0164309 A1 and US 2007/0072360 A1, and U.S. Pat. Nos. 6,946,719, 6,952,030, 6,853,049, disclosing memory cells and methods of making and/or using thereof, are hereby incorporated by reference in their entirety.

In preferred embodiments, the memory cell includes a cylindrical or quasi-cylindrical (i.e., quasi-cylinder having a hexagonal cross section) semiconductor diode 212 located in series with the storage element 205. The diode and the storage element are disposed between two electrodes 211, 213, as illustrated in FIG. 7. For a detailed description of a the design of a memory cell comprising a diode and an antifuse, see for example U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.), each of which is hereby incorporated by reference.

As a non-limiting example, FIG. 7 illustrates the perspective view of a memory cell formed according to a preferred embodiment of the present invention. A bottom conductor 211 is formed of a conductive material, for example tungsten, and extends in a first direction. Barrier and adhesion layers, such as TiN layers, may be included in bottom conductor 211. The semiconductor diode 212 has a bottom heavily doped n-type region 206; an intrinsic region 207, which is not intentionally doped; and a top heavily doped p-type region 208, though the orientation of this diode may be reversed. Such a diode, regardless of its orientation, will be referred to as a p-i-n diode or simply diode. The resistivity switching layer 205 is disposed on the diode, either on the p-type region or below the n-region of the diode. Top conductor 213 may be formed in the same manner and of the same materials as bottom conductor 211, and extends in a second direction different from the first direction. The semiconductor diode 212 is vertically disposed between bottom conductor 211 and top conductor 213. The diode can comprise any single crystal, polycrystalline, or amorphous semiconductor material, such as silicon, germanium, or silicon-germanium alloys.

The above described memory cell shown in FIG. 7 may be located in a one memory level device. If desired, additional memory levels can be formed above the first memory level to form a monolithic three dimensional memory array. In some embodiments, conductors can be shared between memory levels; i.e. top conductor 213 shown in FIG. 7 would serve as the bottom conductor of the next memory level. In other embodiments, an interlevel dielectric is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed:

1. A method of making a device, comprising:
    forming at least one anodizable metal layer over a semiconductor device;
    forming a plurality of pores in the anodizable metal layer by anodization of the anodizable metal layer to expose a portion of the semiconductor device;
    filling at least one pore with a rewritable material such that at least some of the rewritable material is in electrical contact with the semiconductor device;
    forming a second anodizable metal layer under the first anodizable metal layer before the step of forming the first anodizable metal layer;
    forming a plurality of pores in the second anodizable metal layer by anodization of the second anodizable metal layer; and
    forming the semiconductor device comprising a p-i-n diode in at least one pore in the second anodized metal layer.

2. The method of claim 1, wherein the at least one anodizable metal layer comprises aluminum.

3. The method of claim 1, wherein the anodization is performed with oxalic acid.

4. The method of claim 1, wherein the rewritable material comprises a storage element of the nonvolatile memory cell and the storage element is one of antifuse, fuse, metal oxide memory, switchable complex metal oxide, carbon nanotube memory, graphene resistivity switchable material, carbon resistivity switchable material, phase change material memory, conductive bridge element, or switchable polymer memory.

5. The method of claim 4, wherein:
    the memory cell is a read/write memory cell or a rewritable memory cell; and
    the memory cell is located in a monolithic three dimensional array of memory cells.

6. The method of claim 1, wherein at least some of the pores have a diameter of about 100 nm or less and an aspect ratio of about 100 or more and at least some of the pores are arranged in a hexagonal array.

7. The method of claim 1, wherein the step of forming at least one anodizable metal layer over at least one of an electrode or a semiconductor device comprises forming a first anodizable metal layer over the electrode.

* * * * *